United States Patent [19]

Dumoulin

[11] Patent Number: 5,387,866
[45] Date of Patent: Feb. 7, 1995

[54] METHODS FOR HIGH-SPEED MEASUREMENT OF SPIN-LATTICE RELAXATION TIMES

[75] Inventor: Charles L. Dumoulin, Ballston Lake, N.Y.

[73] Assignee: General Electric Company, Schenectady, N.Y.

[21] Appl. No.: 105,249

[22] Filed: Aug. 12, 1993

[51] Int. Cl.⁶ .............................. G01R 33/20
[52] U.S. Cl. ...................... 324/309; 324/300
[58] Field of Search ............ 324/307, 309, 300

[56] References Cited

U.S. PATENT DOCUMENTS

| | | | |
|---|---|---|---|
| 4,549,140 | 10/1985 | MacFall | 324/309 |
| 4,577,152 | 3/1986 | Macovski | 324/309 |
| 4,604,579 | 8/1986 | Cannon et al. | 324/309 |
| 4,698,593 | 10/1987 | Crooks | 324/309 |
| 4,733,186 | 3/1988 | Oppelt et al. | 324/309 |
| 4,908,578 | 3/1990 | Van Liere | 324/309 |
| 5,049,820 | 9/1991 | Briand et al. | 324/309 |

OTHER PUBLICATIONS

Numerical Recipes in Fortran, The Art of Scientific Computing, William Press, et al., pp. 678–683, 1992.
Proceedings of the Eleventh Annual Meeting of the Society of Magnetic Resonance in Medicine, by Campeau, et al., pp. 434, 1992.

Primary Examiner—Kenneth A. Wieder
Assistant Examiner—Raymond Y. Mah
Attorney, Agent, or Firm—Lawrence P. Zale; Marvin Snyder

[57] ABSTRACT

A magnetic resonance system employs a sequence of radio frequency pulses and magnetic field gradients to detect and measure the spin-relaxation time $T_1$ of a selected portion of a sample. Spin-lattice relaxation times are determined by first inverting longitudinal spin magnetization and then detecting the recovery of this magnetization with a series of detection radio frequency pulses. The inversion pulse is applied to the entire sample, but the detection pulses are applied to selected portions of the sample. Each detection pulse is applied in a unique location of the sample, thereby increasing the accuracy of the measurement and permitting the use of multiple detection pulses after a single inversion pulse.

3 Claims, 6 Drawing Sheets

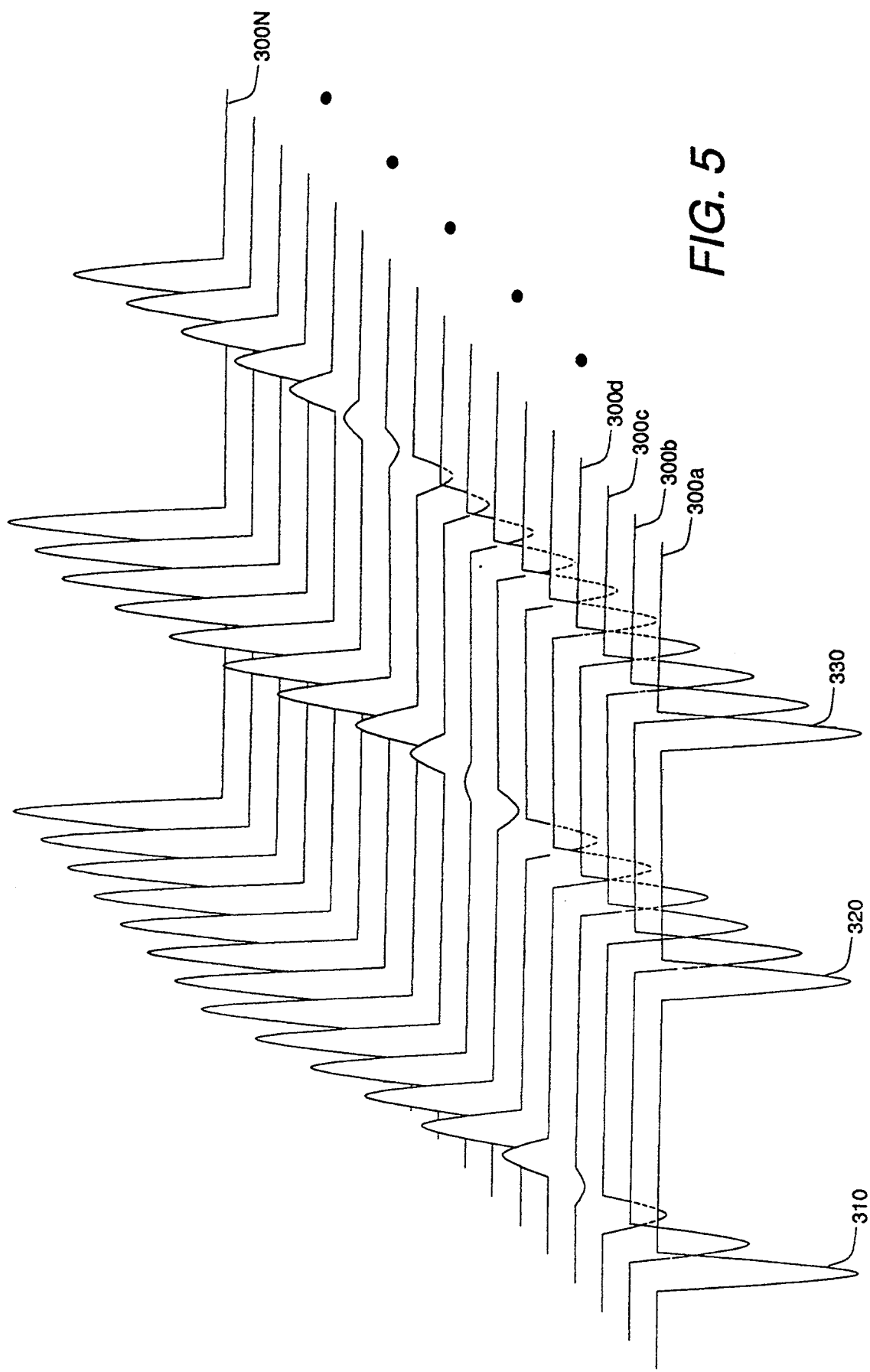

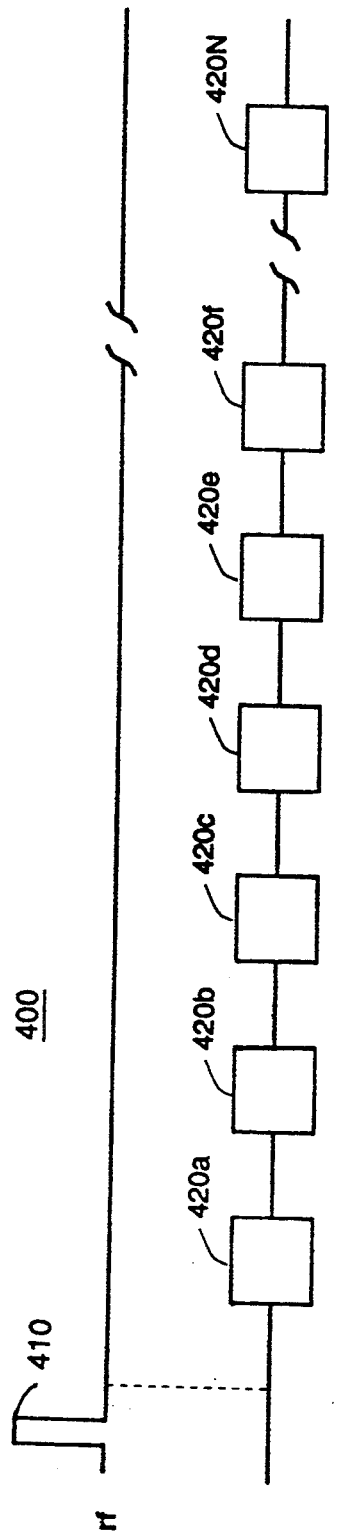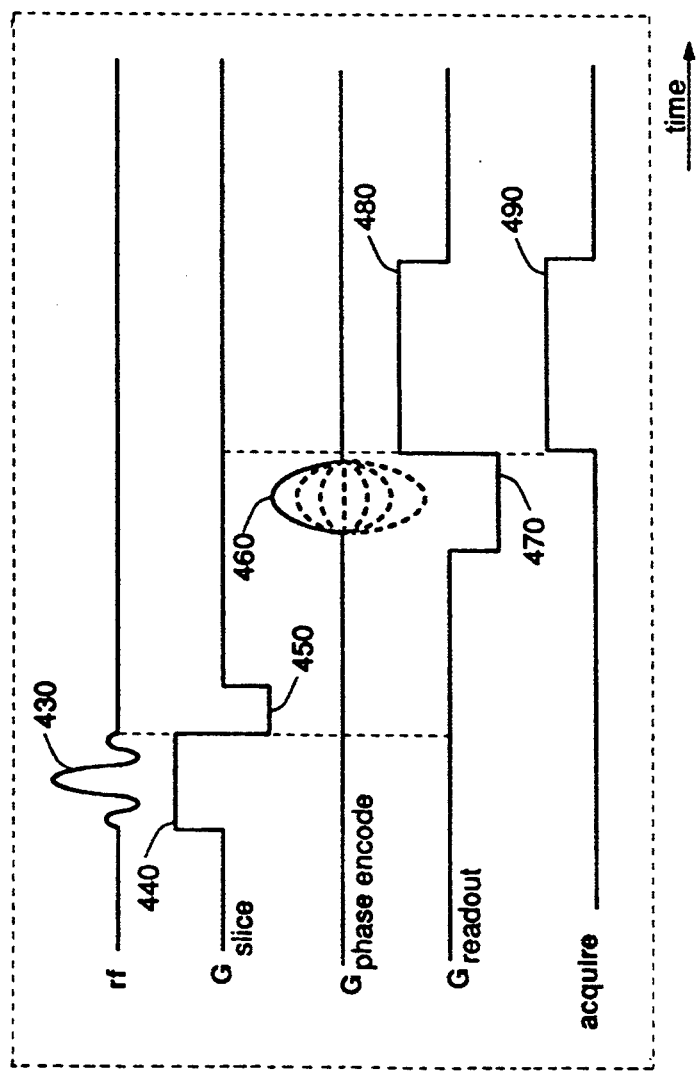
FIG. 6a
FIG. 6b

METHODS FOR HIGH-SPEED MEASUREMENT OF SPIN-LATTICE RELAXATION TIMES

CROSS REFERENCE TO RELATED APPLICATIONS

This application is related to application "Methods for Measurement of Longitudinal Spin Relaxation Times in Moving Liquids" (Ser. No. 08/105,256, still pending) and "Magnetic Resonance Method of Measuring Kidney Filtration Rates" (Ser. No. 08/105,239, still pending) both by Charles L. Dumoulin, filed concurrently with this application and assigned to the present assignee.

BACKGROUND OF THE INVENTION

1. Field of the Invention

The present invention relates to the fields of nuclear magnetic resonance spectroscopy and magnetic resonance (MR) imaging, and more specifically to the field of longitudinal spin relaxation time measurement.

2. Discussion of Prior Art

Presently, the measurement of spin-lattice relaxation times is a useful procedure in the fields of both high-resolution Nuclear Magnetic Resonance (NMR) spectroscopy and in Magnetic Resonance Imaging. In these procedures a sample (or subject) is placed in a magnet causing resonating nuclei of the subject, or "nuclear spins", to generate longitudinal spin magnetization. In a common procedure, this magnetization is inverted by the application of a radio frequency pulse to the subject capable of nutating the longitudinal spin magnetization 180°. When the magnetization of the sample's nuclear spins is inverted, it spontaneously returns to the non-inverted equilibrium state. The return to the equilibrium state occurs in an exponential fashion having a half-life which is characteristic of the molecular environment of the nuclear spin. This half-life is frequently given the name longitudinal spin relaxation time, $T_1$.

During the return to the equilibrium (or fully relaxed) state, the longitudinal magnetization cannot be directly detected. The instantaneous amount of longitudinal magnetization can be measured, however, by applying a sampling radio frequency (RF) pulse. This sampling RF pulse nutates the longitudinal magnetization into the transverse plane, thereby creating transverse spin magnetization. Maximum transverse spin magnetization is generated by the application of a 90° nutation. Unlike longitudinal magnetization, transverse spin magnetization is capable of inducing a signal in a receiver coil placed near the sample.

The signal induced in a receiver coil carries significant information about the local environment of signal generating nuclei. If the signal is acquired in a homogeneous magnetic field, the spectral components of the signal can be resolved to provide a nuclear magnetic spectrum in which different peaks arise from populations of nuclei in different molecules (or parts of a molecule). The $T_1$ of individual peaks can vary considerably across a spectrum and can provide useful analytical information about molecular structure.

If the spatial distribution of transverse spin magnetization is to be measured (as in MRI), the transverse spin magnetization can be phase shifted using magnetic field gradient pulses of selected intensities and durations. These gradient-induced phase shifts encode the position of spin magnetization within the magnet. Two or three-dimensional images of the distribution of spin magnetization can be generated by repeating the sequence of RF and magnetic field gradient pulses and acquiring the MR signal responsive to a collection of magnetic field gradient intensities.

Measurement of $T_1$ with previously available methods in NMR spectroscopy and MR imaging typically requires a long acquisition time. This is because the longitudinal magnetization must be measured at multiple points in time after the inversion pulse to accurately determine the half-life of the recovery. Only a single sampling pulse can be used during the recovery process. This is because application of a sampling pulse disturbs the longitudinal spin magnetization, and thus compromises the integrity of measurements generated by any subsequent sampling pulses. Furthermore, best results are obtained when full recovery of longitudinal spin magnetization occurs after each sampling pulse. For in-vivo applications the time for full relaxation is between 1500 and 5000 ms, since most in-vivo $T_1$ values are between 300 and 1000 ms. Measurement of $T_1$ for each pixel in an image may require exam times as long as an hour, since enough data must be acquired to construct an image (typically with a resolution of 256×256), for each of several sampling times (typically 4–8) after each inversion pulse.

An alternative method for in-vivo $T_1$ measurement described by Campeau et. al. in the Proceedings of the Eleventh Annual Meeting of the Society of Magnetic Resonance in Medicine, 1992, pg. 434, employs a series of slice selective inversion pulses which excite slices placed orthogonal to the image plane of an acquired MR image. Each inverted slice is in a unique location and each inversion pulse is applied at a unique time before the application of the transverse spin magnetization generation pulse of the imaging pulse sequence. If the acquired image has relatively large features of homogeneous $T_1$, (e.g. a large skeletal muscle) the resulting image will contain a series of stripes, each created by spin inversion at selected times prior to the application of the detection pulse. The $T_1$ values of the selected image feature can then be determined by measuring the pixel intensity in each stripe corresponding to each inversion delay time and fitting the result to an exponential equation to determine the rate constant, $T_1$. While this method is relatively fast, it is not suited for the $T_1$ measurement of small features such as the blood in a selected blood vessel. The technique is also poorly suited for $T_1$ measurement of moving blood, since blood motion during the period between each selective inversion pulse and the detection pulse causes mixing of the inverted boluses of blood.

OBJECTS OF THE INVENTION

An object of the present invention is to provide a system which is capable of rapid longitudinal spin relaxation time, $T_1$ measurement of one or more spectral peaks in a nuclear magnetic resonance spectrum.

Another object of the present invention is to provide a system which rapidly measures the longitudinal spin relaxation time, $T_1$ of selected tissues within a living subject.

Another object of the present invention is to provide a method in which longitudinal spin relaxation time, $T_1$ measurements of moving blood are used to assess renal function.

SUMMARY OF THE INVENTION

In the present invention, a sample is placed in a the magnetic field generated by either a Nuclear Magnetic Resonance (NMR) spectroscopy system or a Magnetic Resonance Imaging (MRI) system. A novel inversion recovery MR pulse sequence is then used to measure the $T_1$ of the sample. This pulse sequence employs an inversion pulse which is not spatially selective which inverts all nuclear spins within a selected portion of the sample. The inversion pulse is followed by a series of detection pulses which nutate the longitudinal magnetization by as much as 90 degrees. These detection pulses are spatially selective and are applied at different locations within the sample. These detection pulses have a slice profile. Since all the spins in the sample are given inverted longitudinal spin magnetization and each detection slice is applied in a unique portion of the sample, longitudinal spin magnetization is accurately sampled. In addition, sampling of longitudinal spin magnetization is performed a plurality, N, times during the recovery process, instead of once as in prior methods. This results in an N-fold reduction in the total scan time.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

FIG. 5 is a diagram illustrating the recovery of longitudinal spin magnetization for spectral peaks in a nuclear magnetic resonance spectrum.

FIGS. 6a and 6b together are a pulse sequence diagram of a second embodiment of the present invention which can be used to rapidly measure the longitudinal spin relaxation time, $T_1$ of a selected portion of a subject in a magnetic resonance image.

DETAILED DESCRIPTION OF THE INVENTION

In the present embodiment of the invention, a sample is placed within the magnet of a nuclear magnetic resonance spectrometer or a magnetic resonance imaging system. A pulse sequence 100 is then applied and the data analyzed.

Figure 1:
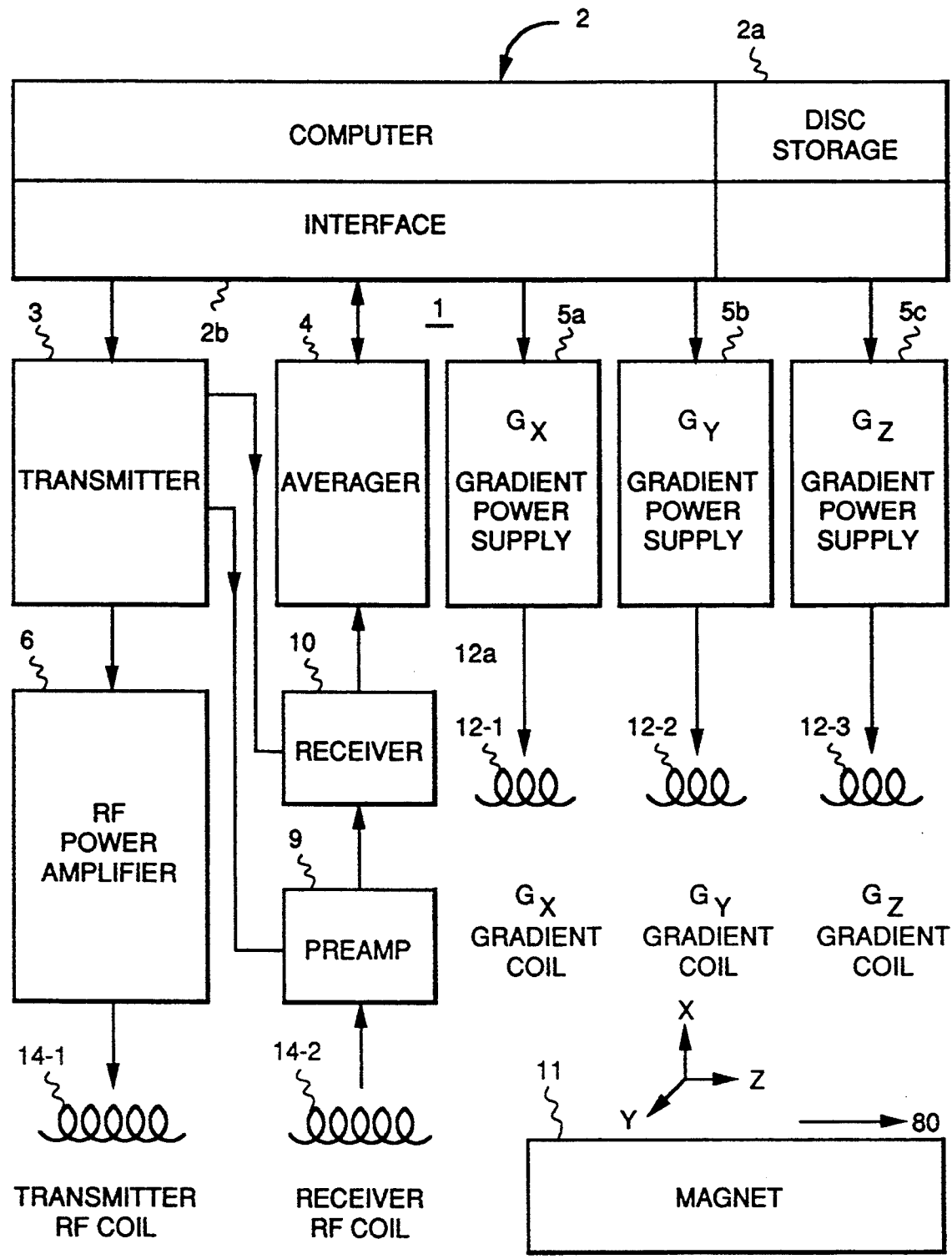
FIG. 1 is a simplified block diagram of a magnetic resonance (MR) imaging system suitable for use with the present invention.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radio frequency (RF) transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients Gx, Gy, Gz, respectively, in the "X", "Y", "Z" directions, respectively, over a subject to be imaged. RF transmitter 3 is gated with pulse envelopes from computer 2 to generate RF pulses having the required modulation to excite an MR response signal from a subject. The RF pules are amplified in an RF power simplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

Transmitter coil 14-1 and receiver RF coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an, RF shielded cage.

Magnetic field gradient coils 12-1, 12-2, and 12-3 are necessary to provide gradients $G_x$, $G_y$, and $G_z$, respectively, that are monotonic and linear over the sample volume. Multivalued gradient fields cause a degradation in the MR response signal data, known as aliasing, which leads to severe image artifacts. Nonlinear gradients cause geometric distortions of the image.

Figure 2:
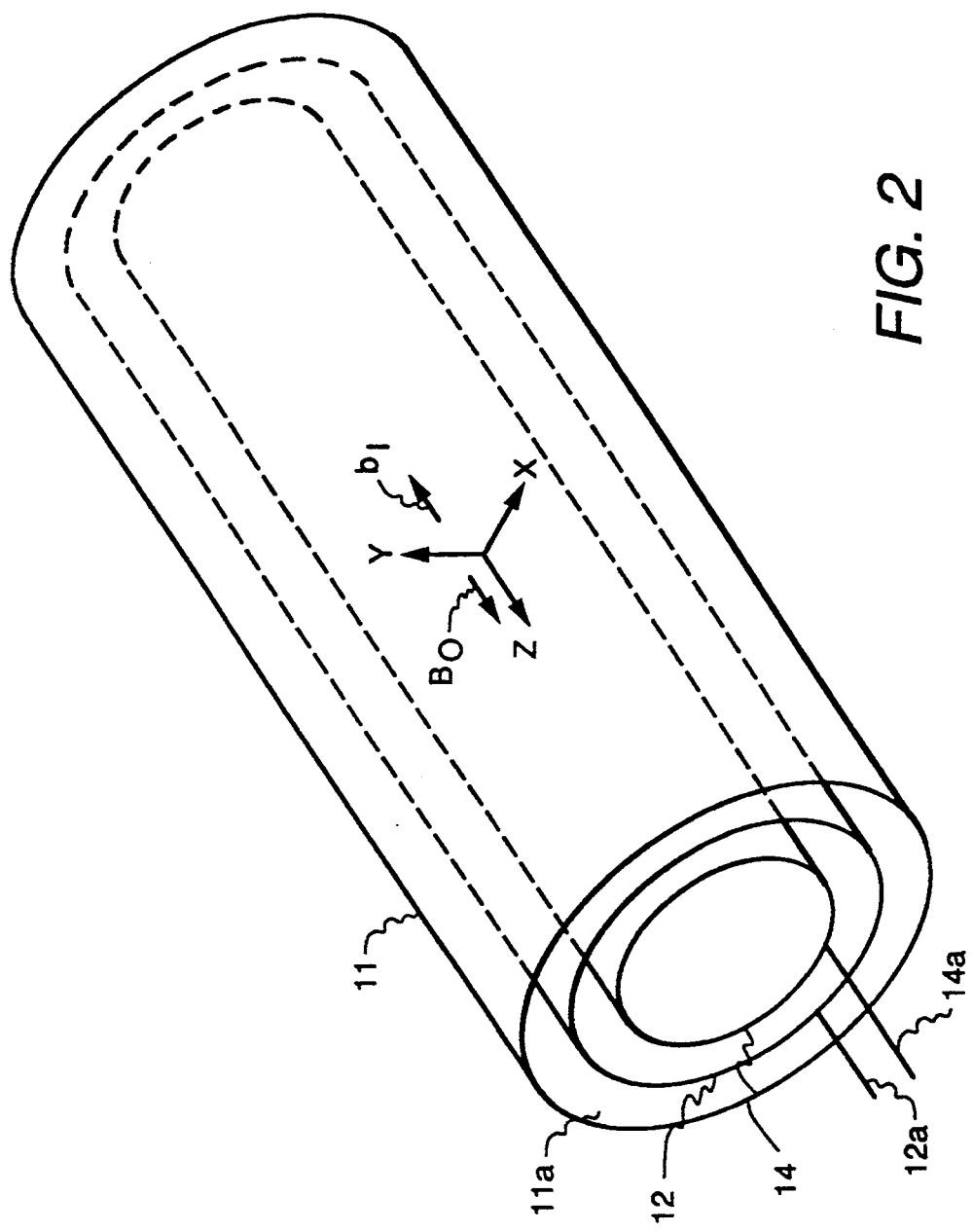
FIG. 2 is a more detailed diagram of the magnet assembly of FIG. 1.

Magnet assembly 11, shown schematically in FIG. 2, has a central cylindrical bore 11a which generates a static magnetic field $B_0$, typically in the axial, or Z Cartesian coordinate direction. A set of coils 12, such as coils 12-1,12-2, 12-3 of FIG. 1, receive electrical signals via input connections 12a, and provide at least one gradient magnetic field within the volume of bore 11a. Also situated within bore 11a is an RF coil 14, which receives RF energy via at least one input cable 14a, to provide an RF magnetic field $b_1$, typically in the X-Y plane.

Figure 3A:
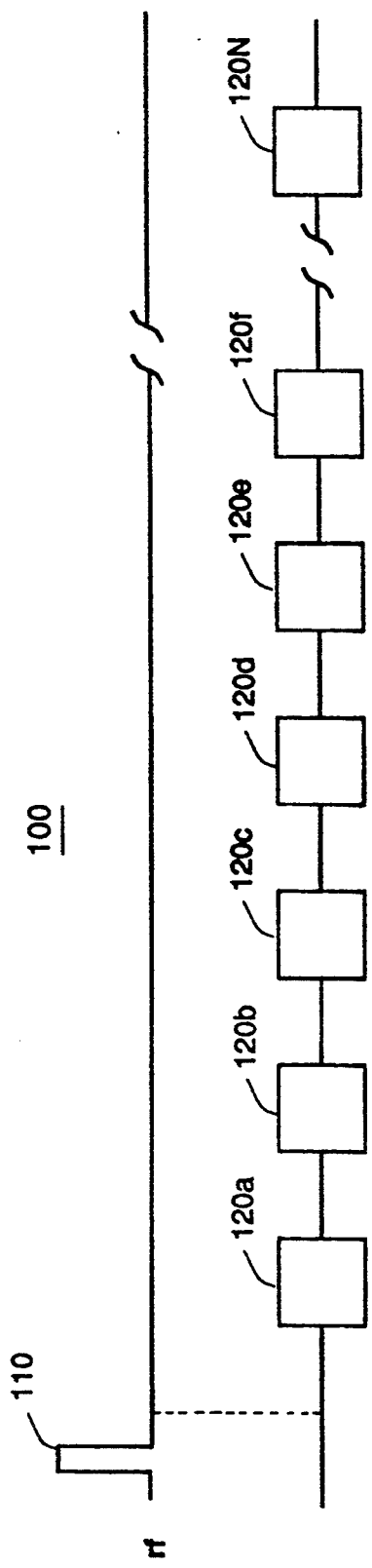
FIGS. 3a and 3b together are longitudinal spin relaxation time, $T_1$ pulse sequence diagram showing a first embodiment of the present invention which can be used to rapidly measure the $T_1$ of selected spectral components in a nuclear magnetic resonance spectrum.
Figure 3B:
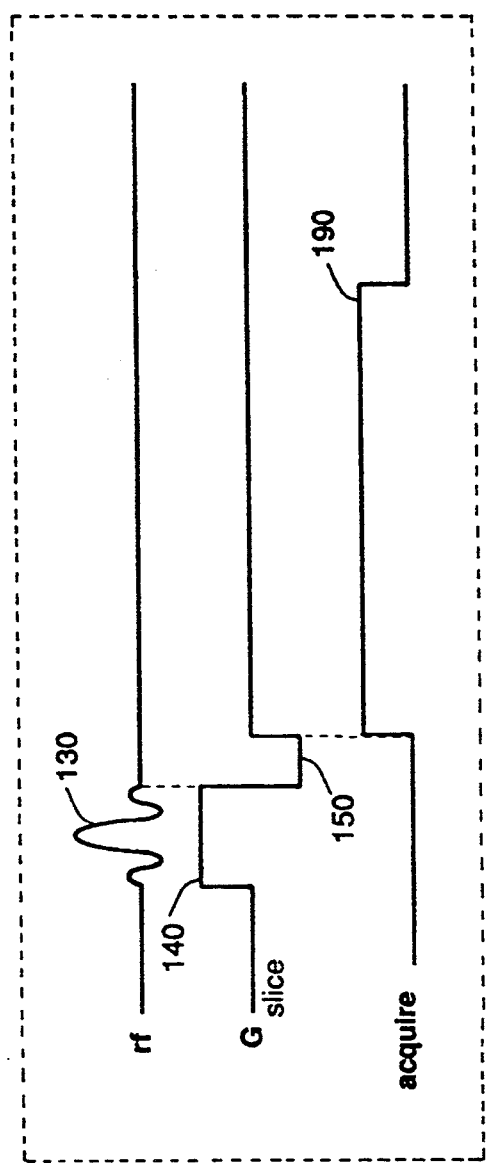

FIGS. 3a and 3b together are a pulse sequence diagram illustrating the radio frequency and magnetic field gradients employed in a first embodiment of the present invention. Pulse sequence 100 consists of a non-selective inversion RF pulse 110 which substantially inverts all spin magnetization within the excitation radio frequency coil of the magnetic resonance system. In the present embodiment of the invention inversion RF pulse 110 is applied without the simultaneous application of a magnetic field gradient pulse. If it is desirable to restrict the volume of inversion, a magnetic field gradient pulse can be applied simultaneously with an inversion pulse in a manner well known to those skilled in the art.

At a selected time after inversion RF pulse 110 is applied, a first subsequence 120a is applied. Subsequence 120a, shown in an enlarged view in FIG. 3b, is comprised of a detection RF pulse 130 which is applied in the presence of a slice selective magnetic field gradient pulse 140. Detection pulse 130 nutates spin magnetization in a selected portion of the subject. The amount of nutation can be selected by selecting the duration and amplitude of detection RF pulse 130. Maximum transverse magnetization is most often obtained with a nutation angle of 90 degrees. The location and size of the selected portion can be adjusted by appropriate selection of the frequency and bandwidth of RF pulse 130 and the amplitude of slice selective magnetic field gradient pulse 140. In the present embodiment of the invention the selected portion has a planar geometry of selected thickness. In alternative embodiments a non-planar geometry such as a cylinder as described in U.S. Pat. No. 5,133,357 "Quantitative Measurement of Blood Flow Using Cylindrically Localized Fourier Velocity Encoding", Jul. 28, 1992 can be used.

After the detection RF pulse 130 and slice selective magnetic field gradient pulse 140 are applied, a slice refocusing magnetic field gradient pulse 150 is applied. Slice refocusing gradient pulse 150 has an amplitude and duration which is selected to cause all transverse spin magnetization within the selected portion of the subject to be substantially in phase after the application of slice selective magnetic field gradient pulse 140. In the present embodiment, the product of the amplitude and duration of slice refocusing gradient pulse 150 is substantially half that of the negative of the product of the amplitude and duration of slice selective gradient pulse 140 in a manner well known to those skilled in the art.

After slice refocusing gradient pulse 150, a data acquire signal pulse 190 is sent to a data acquisition subsystem which is part of the magnetic resonance system. MR signals are digitized during data acquire pulse 190. Since the MR signals coming from transverse spin magnetization within the sample are acquired in a substantially homogeneous magnetic field, each detected MR signal will have a frequency which is determined by the chemical shift of the transverse magnetization. The chemical shift of each signal source can be determined by applying a Fourier transformation to the acquired signal data in a fashion well known to those skilled in the art.

At a selected time interval after the application of subsequence 120a, a second subsequence 120b is applied. Subsequence 120b is substantially identical to subsequence 120a with the exception of detection RF pulse 130 which is given a frequency offset different to that used in the first subsequence 120a. The frequency offset in subsequence 120b is chosen to cause detection RF pulse 130 to excite a selected portion of the sample which was not excited in the first subsequence 120a. Data acquired responsive to subsequence 120b is stored in its own location.

Subsequence 120b is followed after a selected interval by a third subsequence 120c and so on until a plurality, N, subsequences have been applied. The detection RF pulse 130 in each subsequence excites a unique portion of the sample. In the embodiment of the invention illustrated in FIG. 3 the interval between each subsequences is the same. In alternative embodiments the intervals can be arbitrarily chosen by the operator.

Figure 4:
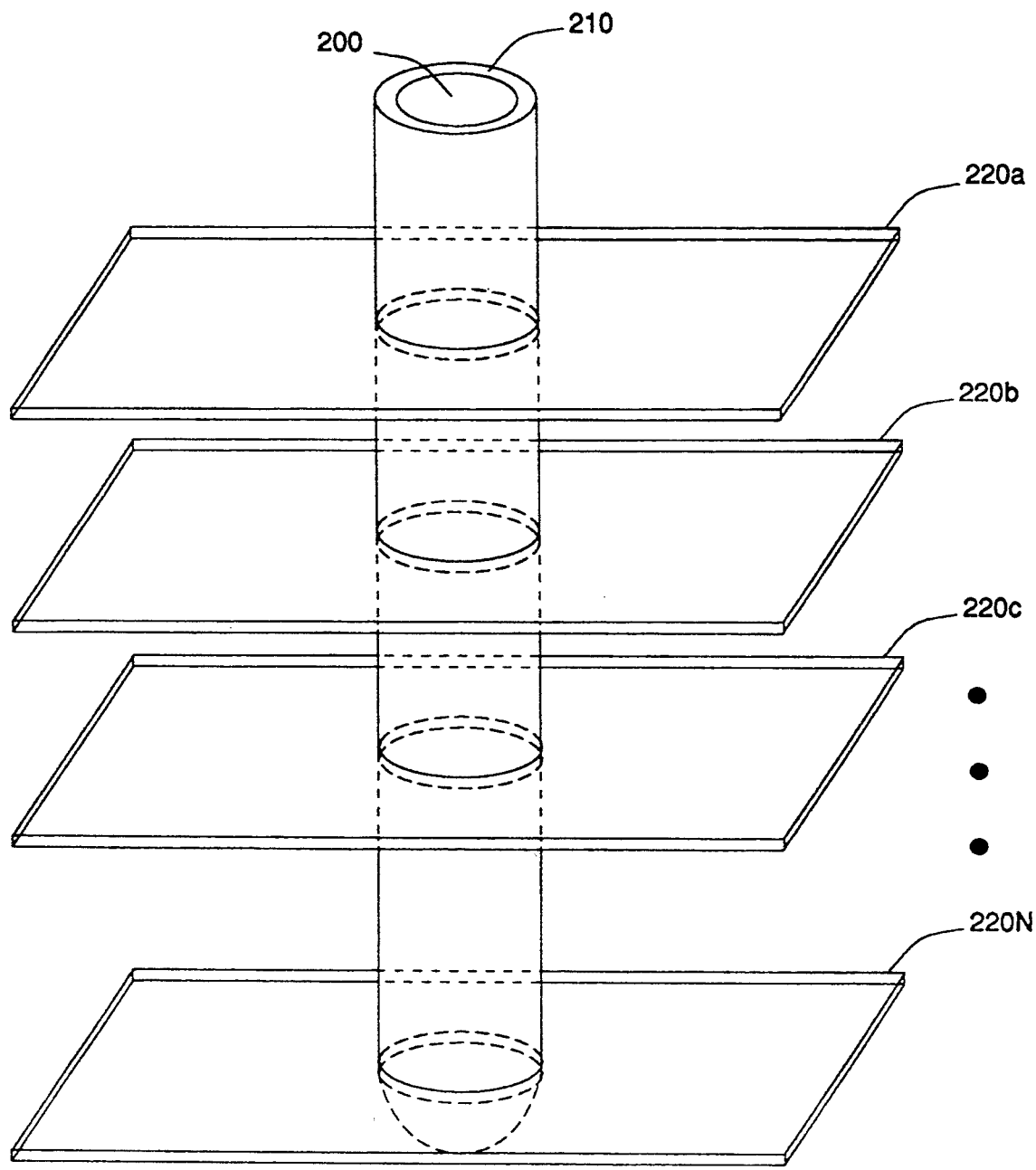
FIG. 4 is an illustration of the scan-plane geometry resulting from the first embodiment of the present invention.

The relative placement of the sample portions excited by detection RF pulse 130 in the N subsequences is illustrated in FIG. 4. Here a sample 200 is contained within a sample tube 210. Detection RF pulse 130 is applied in region 220a in subsequence 120a, in region 220b in subsequence 120b, in region 220c in subsequence 220c and so on until a total of N regions have been subjected to detection pulse 130.

Pulse sequence 100 is applied to the sample Y times where Y is a whole number greater than zero. If Y is greater than one, the signal-to-noise ratio of the digitized signals can be increased by signal averaging the detected data in a fashion well known to those skilled in the art.

Once data has been collected responsive to Y repetitions of N subsequences, a total of N nuclear magnetic resonance spectra can be constructed. This is illustrated in FIG. 5. Here a first spectral peak 310, a second spectral peak 320 and a third spectral peak 330 are shown. Spectral peaks 310, 320 330 are detected in a first spectrum 300a, a second spectrum 300b, a third spectrum 300c and so on for a total of N spectra. Note that each spectrum arises from a different selected portion of the sample.

The spectral peaks 310, 320, 330 in the N spectra have intensities which vary as a function of a time interval, t, between inversion RF pulse (110 of FIG. 3) and detection RF pulse (130 of FIG. 3) of each respective subsequence. The signal intensity, I, for a peak having a single recovery rate, $T_1$, can be described by the equation:

$$I = A + B^* exp(-t/T_1) \qquad [1]$$

where A and B are constants. $T_1$, A and B of any desired peak can be determined by fitting equation 1 to the intensities of the peak obtained in each of the subsequences. This can be done using a non-linear least square optimization procedure such as that described in "Numerical recipes in FORTRAN" by W. H. Press, S. A. Teukolsky, W. T. Vetterling and B. P. Flannery, p. 678–683.

In FIG. 5 the first spectral peak 310 is shown to have a more rapid recovery than second spectral peak 320 which in turn has a more rapid recovery than third spectral peak 330.

FIGS. 6a and 6b together illustrates a second embodiment of the present invention. Like the embodiment described above in FIGS. 3a and 3b, pulse sequence 400 of FIG. 6a has an inversion RF pulse 410 followed by a plurality, N, of subsequences 420a–400N. Each pulse subsequence, shown in an enlarged view in FIG. 6b, is further comprised of a detection RF pulse 430, a slice select magnetic field gradient pulse 440, slice refocusing magnetic field gradient pulse 450, and a data acquire signal pulse 490. As in pulse sequence 100, the detection RF pulse in each subsequence is made to excite a unique portion of the sample.

After detection RF pulse 430 and slice selective gradient pulse 440 have been applied, a phase encoding magnetic field gradient pulse 460 of a selected amplitude is applied. In the present embodiment of the invention the phase encoding gradient pulse 460 is applied in a direction substantially orthogonal to slice selective gradient pulse 440 and can be applied simultaneously with slice refocusing pulse 450 if desired. For the sake of clarity, phase encoding pulse 460 and slice refocusing pulse 450 are not shown to be simultaneous in FIG. 6, but it is possible that both may be applied simultaneously. In alternative embodiments of the invention phase encoding gradient pulse 460 can be applied in a direction substantially the same as slice selective gradient pulse 440.

After detection RF pulse 430 and slice selective gradient pulse 440 are applied, a readout dephasing magnetic field gradient pulse 470 of a selected amplitude is applied. Readout dephasing gradient pulse 470 is applied in a direction substantially orthogonal to phase encoding pulse 460. Readout dephasing pulse 470 can be applied simultaneously with either slice refocusing pulse 450 or phase encoding pulse 460 if desired. Readout dephasing pulse 470 causes transverse magnetization at different positions along the direction of the readout dephasing magnetic field gradient to obtain phase shifts which are proportional to position in the readout direction.

Following the application of slice refocusing pulse 450, phase encoding pulse 460 and readout dephasing pulse 470, a readout magnetic field gradient pulse 480 is applied. Readout pulse 480 is applied in the same direction as readout dephasing pulse 470, but is given the opposite polarity. The amplitude and duration of readout pulse 480 is selected so that substantially all transverse spin magnetization has an identical phase shift at a selected point during readout pulse 480.

Pulse sequence 400 is repeated a plurality, Y, times. In each repetition of pulse sequence 400, phase encoding pulse 460 is given a different amplitude. For each repetition of pulse sequence 400, however, the amplitude of phase encoding pulse 460 is identical for each subsequence 420a–420N. Phase encoding pulse 460 causes phase shifts in the detected MR signals which are proportional to the position of transverse spin magnetization along the direction of phase encoding magnetic field gradient 460. Data acquired responsive to different amplitudes of phase encoding gradient 460 can be Fourier transformed to give the position (in the direction of phase encoding gradient 460) of the signal producing transverse spin magnetization in a manner well known to those skilled in the art.

Once data has been collected responsive to Y repetitions of N subsequences, a total of N magnetic resonance images can be constructed. These N images will have pixels whose intensities vary as a function of a time interval, t, between inversion RF pulse 410 and detection RF pulse 430 of each respective subsequence. The signal intensity, I, for a pixel having a single recovery rate, $T_1$, can be described by equation [1]. $T_1$, A and B of any desired pixel can be determined by fitting equation 1 to the intensities of the pixel obtained in each of the subsequences using a non-linear least square optimization procedure such as that described above.

While several presently preferred embodiments of the novel $T_1$ measurement system have been described in detail herein, many modifications and variations will now become apparent to those skilled in the art. It is, therefore, to be understood that the appended claims are intended to cover all such modifications and variations as fall within the true spirit of the invention.

What is claimed is:

1. A method of measuring spin lattice relaxation time, $T_1$, within a subject comprising the steps of:
    a) placing said subject in a magnetic field to generator longitudinal spin magnetization of nuclear spins within the subject;
    b) applying a spatially non-selective radio frequency (RF) pulse to invert the longitudinal magnetization of the nuclear spins;
    c) applying a spatially selective RF pulse having a predetermined frequency range to convert longitudinal magnetization into transverse spin magnetization of a selected ensemble of nuclear spins of a spatial region defined by the frequency range;
    d) detecting at a time n, magnetic resonance signals generated by the transverse spin magnetization of the selected ensemble of nuclear spins;
    e) repeating steps 'c' through 'd' for a plurality of 'N' repetitions each having a different frequency range for the spatially selective RF pulse, to detect 'N' MR response signals from different spatial regions each detected at a different time 'n' after application of the spatially non-selective RF pulse to encode in a time dimension;
    f) selecting a subset of the ensemble of nuclear spins; and
    g) determining the spin lattice relaxation time, $T_1$, for the selected subset of the ensemble of nuclear spins, the spin relaxation time being an exponential recovery rate of the MR response signal of the selected subset as a function of time.

2. A method of measuring spin lattice relaxation time, $T_1$, of nuclear spins within a subject comprising the steps of:
    a) placing said subject in a magnetic field to generate longitudinal spin magnetization of said nuclear spins;
    b) applying a spatially non-selective radio-frequency (RF) pulse to invert the longitudinal magnetization of the nuclear spins;
    c) applying a spatially selective RF pulse having a predetermined frequency range to convert longitudinal magnetization into transverse spin magnetization in a selected ensemble of nuclear spins of a spatial region defined by the frequency range;
    d) applying a phase-encoding magnetic field gradient pulse having an amplitude 'a' to induce a phase evolution in the nuclear spins which is dependent upon the position of the nuclear spins in a phase-encoding direction;
    e) applying a readout dephasing magnetic field gradient pulse to induce a phase evolution in the nuclear spins which is dependent upon the position of the nuclear spins in a readout direction, substantially orthogonal to the phase-encoding direction;
    f) applying a readout magnetic field gradient pulse during detection of the magnetic resonance (MR) response signals to induce a phase evolution in the nuclear spins which is dependent upon the position of the nuclear spins in the readout direction;
    g) detecting at a time n and for a phase encoding amplitude 'a', a MR response signal having inherent phase shifts induced by the phase evolutions of the selected ensemble of nuclear spins;
    h) repeating steps 'c' through 'e' for a plurality of 'N' repetitions each having a different frequency range for the spatially selective RF pulse, to detect 'N' MR response signals from different spatial regions each detected at a different time 'n' after application of the spatially non-selective RF pulse, to encode in a time dimension;

i) repeating steps 'b'–'h' for a plurality of 'P' different phase encoding gradient amplitudes 'a' to encode the detected MR response signal in a phase-encoding direction;

j) selecting a subset of the ensemble of nuclear spins being a spatial subregion having dimensions in the phase encoding direction and the readout direction; and k) determining the spin lattice relaxation time, $T_1$, for the selected subset of the ensemble of nuclear spins by calculating changes over time in portions of the MR response signal pertaining to the selected subset.

3. The method of claim 2 wherein a plurality of spatial MR images are created from the MR response signals, with the 'nth' MR image being created from the MR response signals detected at time 'n'.

* * * * *